US006114873A

United States Patent [19]
Sahraoui et al.

[11] Patent Number: 6,114,873
[45] Date of Patent: Sep. 5, 2000

[54] CONTENT ADDRESSABLE MEMORY PROGRAMMABLE ARRAY

[75] Inventors: Zohair M. Sahraoui, Ottawa; John M. Chapman, Ashton, both of Canada; James S. Fujimoto, North Brunswick, N.J.; Andrew E. King, Kanata, Canada; Andrew C. E. LaCroix, Toronto, Canada; Steven W. Wood, Kanata, Canada

[73] Assignee: Nortel Networks Corporation, Montreal, Canada

[21] Appl. No.: 09/213,259

[22] Filed: Dec. 17, 1998

[51] Int. Cl.[7] .................................................. H03K 19/177
[52] U.S. Cl. .................................................. 326/39; 326/41
[58] Field of Search .......................................... 326/37–41

[56] References Cited

U.S. PATENT DOCUMENTS

| | | | |
|---|---|---|---|
| 5,363,499 | 11/1994 | Glass | 395/425 |
| 5,408,434 | 4/1995 | Stansfield | 365/189.08 |
| 5,473,267 | 12/1995 | Stansfield | 326/41 |
| 5,557,218 | 9/1996 | Jang | 326/40 |
| 5,687,325 | 11/1997 | Chang | 326/41 |
| 5,815,726 | 9/1998 | Cliff | 326/41 |

*Primary Examiner*—Michael Tokar
*Assistant Examiner*—Don Phu Le
*Attorney, Agent, or Firm*—Foley & Lardner

[57] ABSTRACT

An array architecture built out of content addressable memories (CAMs) is disclosed. This architecture is re-programmable and exhibits pre-synthesis deterministic timing behavior. This architecture can be re-programmed to store control-flow as well as data-flow dominated applications. The target application is partitioned into basic functional units, which are then transformed to a representation suitable for storage in CAMs.

20 Claims, 8 Drawing Sheets

CONTENT ADDRESSABLE MEMORY PROGRAMMABLE ARRAY

TECHNICAL FIELD

The present invention relates to a programmable array and a programmable logic device based on a content addressable memory (CAM).

BACKGROUND INFORMATION

Field programmable gate arrays (FPGAs) are known as programmable logic devices which offer higher densities than any other programmable logic devices. The architecture of FPGAs is array based. The entire device is constituted of a two-dimensional array of programmable logic blocks that can be interconnected via horizontal and vertical routing channels. The programmable logic blocks are look-up tables (LUTs) grouped into pairs or trios and provided with flip-flops. LUTs can be configured to perform one-output Boolean functions and therefore can be used to map any type of logic gate. The mapping process involves the transformation of the gate to its truth table. The truth table specifies for which input combinations the gate delivers a logic one, and for which input combinations the gate delivers a logic zero. The gate truth table is stored in the LUT: each entry in the truth table is stored in one entry of the LUTs. Therefore, to store the truth table of a n-input gate, $2^n$ entries are needed. Usually, the number of gate inputs is limited to reasonable values, as not to provoke a combinatorial explosion in the number of LUT entries.

The horizontal and vertical routing channels in an FPGA are made of several type of tracks. Each type provides different connection capabilities, buffering capabilities and timing attributes. Both horizontal and vertical routing channels can be configured to connect any logic block to any other block or blocks in the two dimensional array. The connections are established by setting switching transistors in order to create or delete a connection. The switching transistors are grouped in two-dimensional programmable matrices, usually referred to as switch matrix (SM). The decision on how to connect a given block to another or other blocks depends on many factors. It depends on how close or how far the blocks to be connected are. It depends on how many tracks and what type of tracks are still available. It depends on how many signals are still left to be routed.

One of the major drawbacks of FPGAs is the difficulty of predicting at compile time, before the design is mapped and routed on the FPGA chip, the timing behavior and performance of the prototype. Because of the randomness of the logic block-to-LUT mapping process, it is not possible to predict the particular route a given signal will travel, and therefore, it becomes an impractical task to determine where are the critical paths, and hence to predict the timing behavior of the prototype before the design is mapped and routed. This drawback is exacerbated by the necessity to use different types of routing tracks, either in order to boost the performance of the prototype, or decrease routing congestions. Another major drawback of FPGAs, is routing congestion. The problem stems from the fact that the programmable logic blocks offer only fine granularity mapping capabilities. Only gates with a reasonable number of inputs, and with only one output can be mapped to logic blocks. The consequence is an increase in the number of signals that have to be routed from one block to another block, a number which is directly proportional to the number of gates in the netlist of the design.

SUMMARY OF THE INVENTION

It is an object of the present invention to provide improved programmable array and programmable logic device.

According to one aspect of the present invention, there is provided a programmable array comprising: a plurality of register transfer level (RTL) building blocks, the RTL building block comprising content addressable memory (CAM) for storing data; an interconnection network for interconnecting the RTL building blocks to perform data input and output between the RTL building blocks; and a signal generation block for providing enable signals to the RTL building blocks in response to a system clock signal, the data input and output being performed, in response to the enable and the system clock signals.

For example, the RTL building block operates in a combinational mode and an arithmetic mode. The signal generation block is mapped to the RTL building block, the CAMs of the RTL building blocks supporting the mapping of digital combinational logic and the mapping of arithmetic operations, both defined at the register transfer (RT) level. The CAMs operates synchronously in response to the enable signals generated by the signal generation block which responds to the system clock signal. The RTL building block stores the combinational part of finite state machines (FSMs), a property that allows it to implement FSM functionality, the RTL building block using CAMs to store digital logic, its timing behavior being deterministic before place and route. The interconnection network connects a two-dimensional array of the RTL building blocks.

The programmable array is constituted of a two-dimensional array of programmable logic blocks. The logic blocks present a number of unique features. They are synchronous because the logic blocks are based on CAM technology. CAMs are inherently synchronous memory devices. The implication is that, knowing the clock frequency of the system, it can be determined that the performance of the architecture for a certain application by calculating the latency. The latency in this case is simply the number of programmable logic blocks that the data flow of the application traverses from inputs to outputs. CAMs are synchronous devices and thus, it suffices to know the system clock frequency and the latency of the application to determine the performance of the architecture.

In the case of the deployment of this architecture in the market, the product will made available in several families of devices. Each family of devices will be characterized by a range of sizes, i.e., storage capability, and by a range of clock frequencies. These two parameters are interdependent, since the clock frequency of the system depends on the size of the device (which is the case in all memory devices). For a certain application, a family of devices will selected depending on how much storage this particular application requires. Thus, by association, the system clock frequency is determined. It is noteworthy that to determine the system clock frequency, the storage required by the application must first be calculated. It implies that the performance of the system can only be known after a partitioning phase, where the application is divided into functional units that can directly mapped to the programmable logic blocks. Therefore, this technology guarantees deterministic pre-compile performance prediction actually covers the ability to predict the performance of the system before the application is placed and routed, but after the application is partitioned.

The logic blocks are defined at the Register Transfer (RT) level. The programmable logic blocks allow the mapping of various functions defined at the RT level, such as arithmetic operations, finite state machines, registers and memory functions. Therefore, all gate-level routing nets (that usually dominate routing in FPGAs) are eliminated. Only RT-level routing nets remain. The number of nets to route is much smaller and the contention for routing resources is much alleviated.

According to another aspect of the present invention, there is provided a programmable logic device comprising: signal generation means for generating enable signals in response to a system clock signal; and a plurality of plane logic array circuits operable in combinational and arithmetic modes in response to the enable and the system clock signals, each plane logic array circuit comprising a plurality of storage means, each storage means comprising content addressable memories (CAMs) for storing mapped data of digital combinational logic or arithmetic operations.

For example, the programmable logic device further comprises means for interconnecting the plane logic array circuits for transmitting the data of digital combinational logic or arithmetic operations between the plane logic array circuits. The clock means is supported by the plurality of plane logic array circuits. The plane logic array circuit stores the combinational part of finite state machines (FSMs), so as to implement FSM functionality. The plane logic array circuit uses CAMs to store digital logic, its timing behavior being deterministic. The CAMs operates synchronously with the system clock. The means for interconnecting comprises means for dynamically routing data between a data source and a data sink, so that the data route can be re-programmed, a data source can be connected to a different data sink and a data source can be connected to more than one data sink. The means for dynamically routing data comprises means for establishing a connection between any data source and any data sink.

BRIEF DESCRIPTION OF THE DRAWINGS

Embodiments of the present invention will now be described by way of example with reference to the accompanying drawings in which.

DETAILED DESCRIPTION

Figure 1:
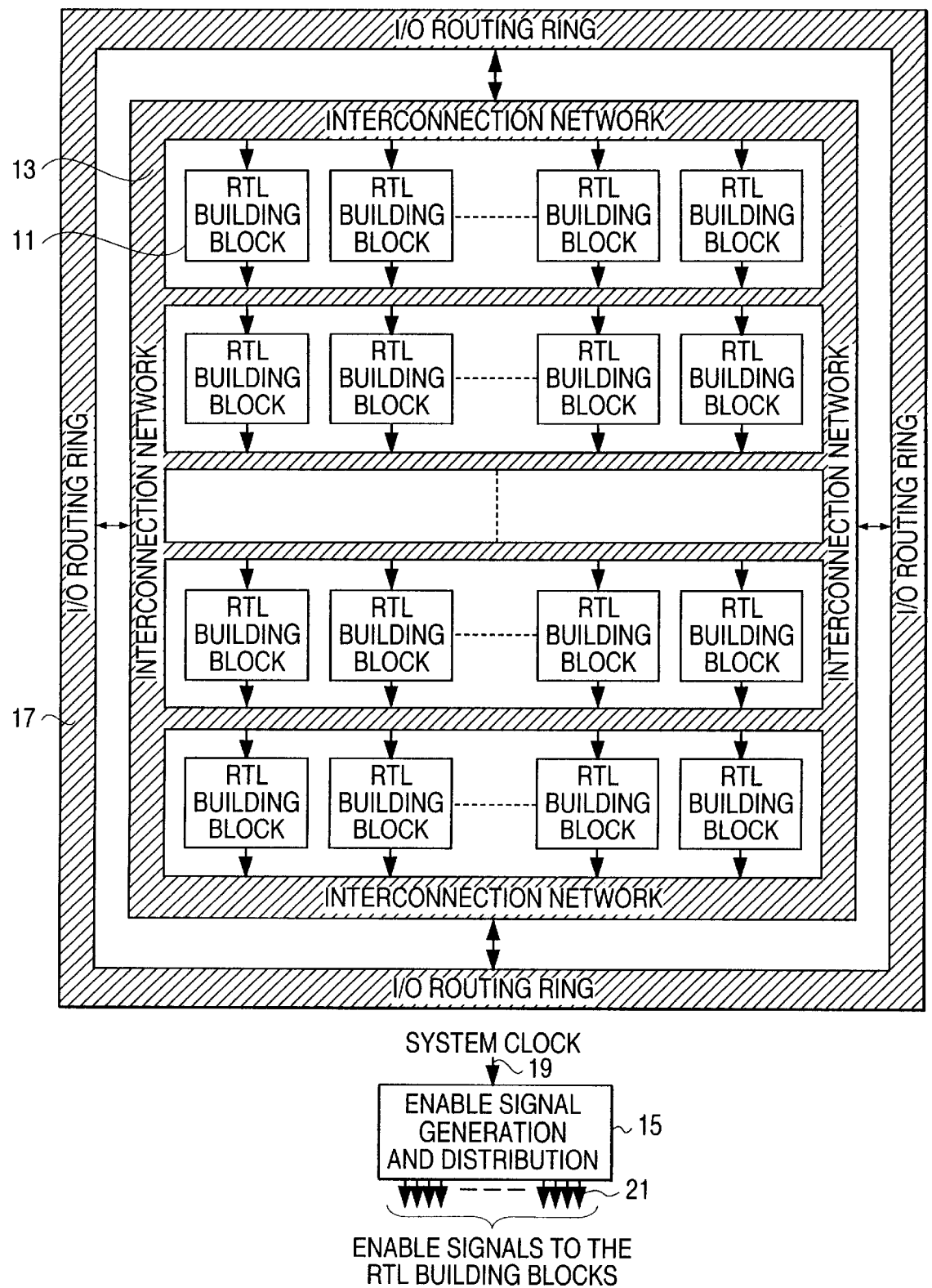
FIG. 1 is the top level view of the array architecture, with all the architectural blocks.

FIG. 1 shows the top level of the array architecture, with all the architectural blocks. In FIG. 1, a complete array architecture includes register transfer level (RTL) building blocks 11, an interconnection network 13, an enable signal generation and distribution (ESGD) block 15, and an input and output (I/O) routing ring 17. The RTL building blocks 11 can store and perform the functionality of random combinational logic, arithmetic operations and finite state machines. All of the RTL building blocks 11 are assumed to perform operations defined at the register transfer level. All of the RTL building blocks 11 can perform the corresponding operation in one system clock cycle. The interconnection network 13 guarantees that all data needed by every RTL building block 11, in order to perform the corresponding operation, is made available to it. The interconnection network 13 also guarantees that the data produced by every RTL building block 11 is collected. The interconnection network 13 also guarantees that the transport of the data from its production point to its consumption point always consumes the exact same amount of clock cycles. In response to a system clock signal 19, the ESGD block 15 provides enable signals 21 to the RTL building blocks 11 to synchronize the data production, consumption and transport in and between the RTL building blocks 11. The I/O routing ring 17 is a versatile interface between the architecture core and I/O pads (not shown).

Figure 2:
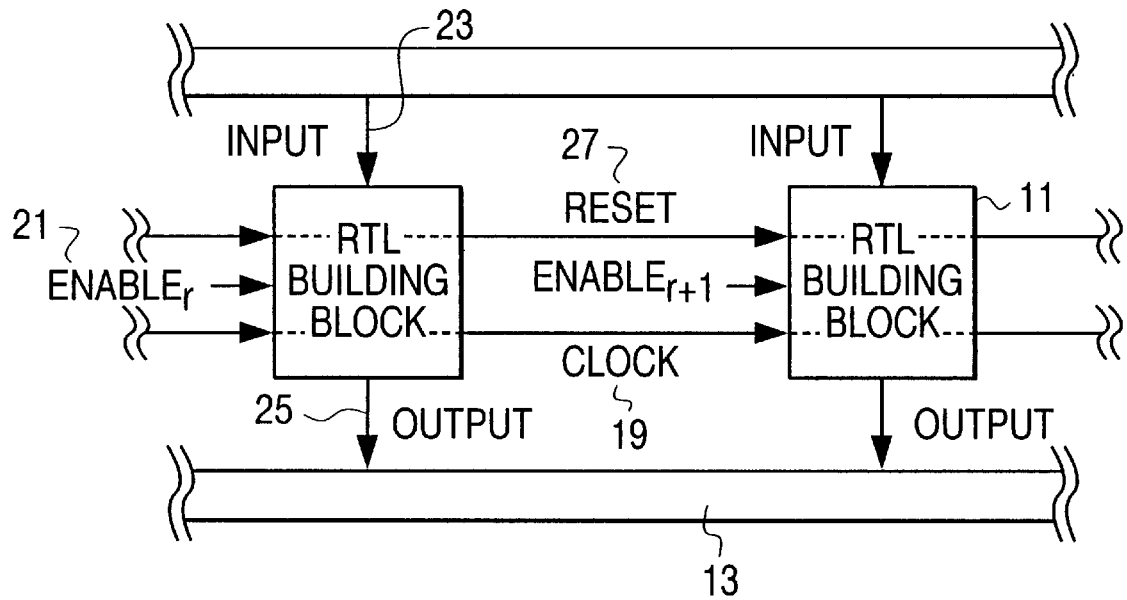
FIG. 2 illustrates the RTL building blocks and their interface.

FIG. 2 shows the interface of the RTL building blocks 11. In FIG. 2, inputs 23 are supplied through the interconnection network 13 to the RTL building blocks 11 and outputs 25 of the RTL building blocks 11 are provided to the interconnection network 13. The system clock signal 19 drives all RTL building blocks 11 in order to guarantee the synchronous operations of the architecture. In addition, all of the RTL building blocks 11 are driven by one single synchronous reset signal 27. When the reset signal 27 is activated, the RTL building blocks 11 deliver output data that can be programmed. Also, every RTL building block 11 is provided with the enable signal 21. The role of the enable signal 21 is to allow or not the processing of the data at the input of the RTL building block 11. In other words, the output of the RTL building block 11 will not change on the next active edge of the clock, unless the enable signal 21 is active. The system clock signal 19 is fed to all logic blocks.

Figure 3:
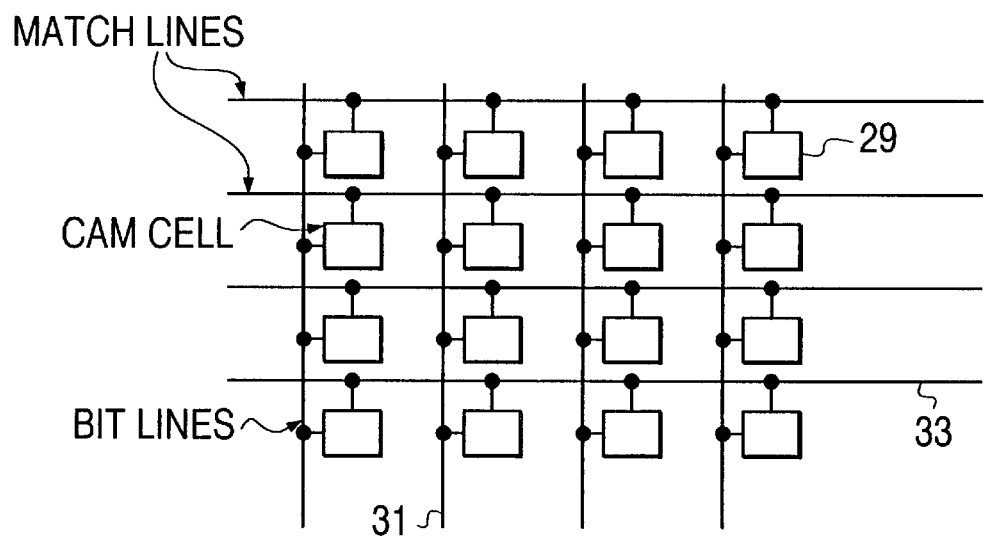
FIG. 3 illustrates an array of CAM cells of the RTL building block.

FIG. 3 shows an array of content addressable memory (CAM) cells. In FIG. 3, CAM cells 29 are linked horizontally by match lines 33 and vertically by bit lines 31. The match line 33 running horizontally carry the result of the comparison between the content of the CAM cells 29 connected to the same line and a reference word (not shown) supplied by the bit lines running vertically.

Figure 4:
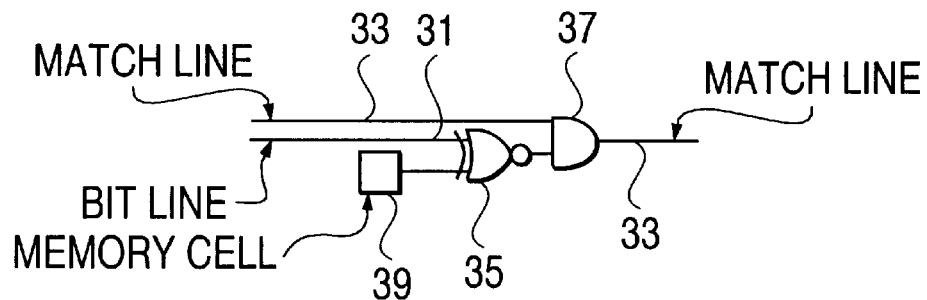
FIG. 4 illustrate a conceptual view of a CAM cell.

FIG. 4 shows a conceptual view of a CAM cell. In FIG. 4, the CAM cell is provided with an exclusive NOR gate 35 that compares the content of a memory cell 39 to a reference bit carried by the bit line 31. The result of the comparison by the exclusive NOR gate 35 is provided to an AND gate 37 which receives the results of previous comparisons. The AND gate 37 yields the answer to the question of whether the content of the CAM cell row matches the reference word. In order to optimize the storage capability of the CAM cell array, the memory cell 39 can store a logic 0, a logic 1, or a don't care value that matches any logic value presented at the input of the memory cell 39.

In the implementation of CAMs, to each row of CAM cells is associated a match line. This association is implementation dependent. However, in general, all CAM cells belonging to the same row are physically connected to the same bit line. The match line, in a first phase, is pre-charged to logic 1(0). This phase is called the pre-charge phase. In a second phase, the evaluation phase, the match line is discharged (charged) through one or more DC paths opened by one or more cells. These cells are the site of a mismatch between the corresponding reference bit and the bit stored in the cell. From a logic point of view, the pre-charge and the evaluation phase implement an AND function between the results of the comparisons that happened in the CAM cells of the same row. Therefore, referring to FIG. 4, the match line 33 is physically the same line, and the AND gate 37 symbolically represents the AND function implemented by the pre-charge and evaluation processes. Thus, functionally, each row the CAM cells implements an AND function, and the whole CAM implements an AND plane.

Figure 5:
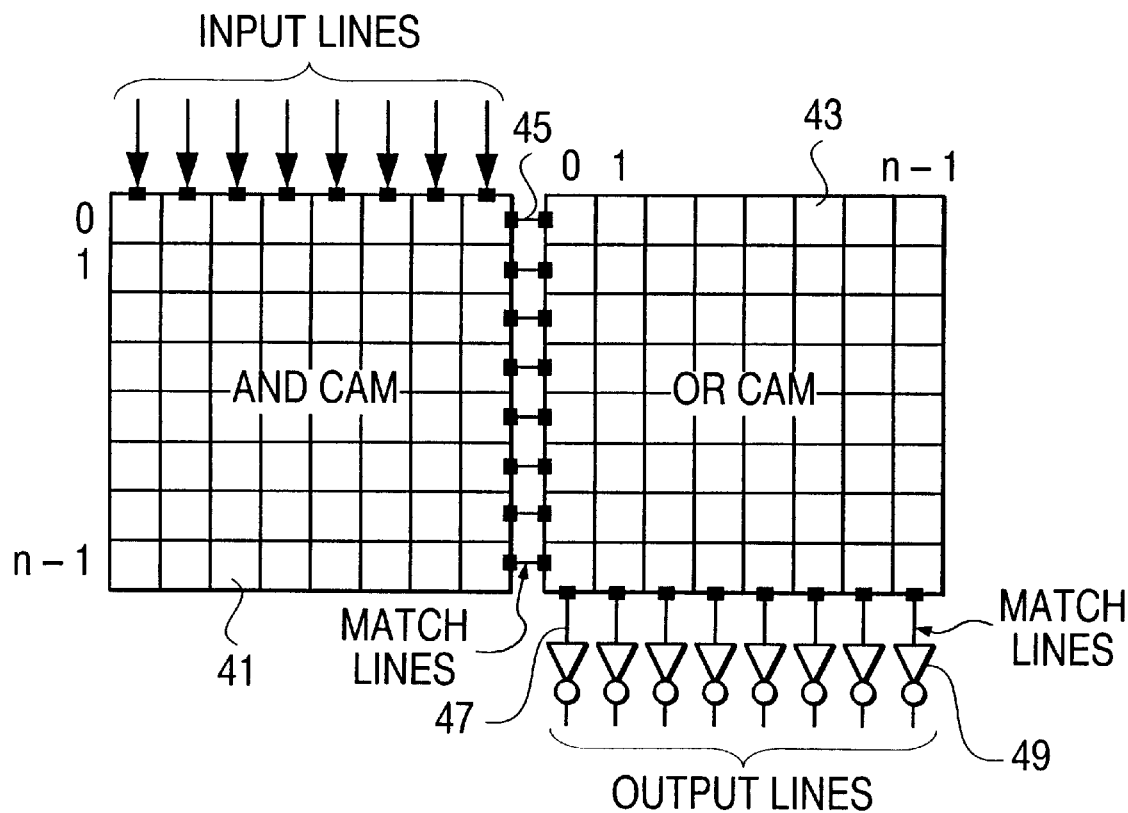
FIG. 5 illustrates a pair of CAMs for storing two-level logic representation of Boolean functions.

FIG. 5 shows a two-dimensional CAM cell array utilized to store random combinational logic and explains how the two-level logic representation of Boolean functions is stored in a pair of CAMs. In FIG. 5, two arrays of an AND CAM 41 and an OR CAM 43 can be combined into one architectural entity to store a two-level representation of random combinational logic. A group of logic functions can be collapsed to a set of sums of products. The set of sums of products can be represented as an AND plane that feeds an OR plane. The AND plane is directly stored in the AND CAM 41, and the OR plane is stored in the OR CAM 43 after the following transformations are performed.

(1) All zeros are transformed to don't care values.
(2) All logic ones are transformed to logic zeros.
(3) The OR plane is rotated 90 degrees counter-clockwise before storage in the OR CAM 43.

The match lines 45 coming out of the AND CAM 41 feed the inputs of the OR CAM 43. The match lines 47 coming out of the OR CAM 43 drive a row of inverters 49. The role of the inverters 49 is to transform the logic signals coming from the OR CAM 43 from negative logic to positive one.

In FIG. 5, input lines connected to the AND CAM 41 carry the reference word to the CAM cells for a comparison with their content. In the architecture, the communication between the different logic blocks is carried through the interconnection network. The reference word of one logic block is the result of comparisons done in another logic block. So, in general, the logic values of one logic block match lines are carried, through the interconnection network, to the bit lines of another logic block, to become the reference word for this block. The AND CAM 41 achieves the AND function. The result of the AND function of each row is carried by the global match line. The OR function can be implemented by using De Morgan's law.

The programmable array is constituted of a two-dimensional array of programmable logic blocks. The logic blocks are based on CAM technology. CAMs are inherently synchronous memory devices. Knowing the frequency of the system clock, it can be determined that the performance of the architecture for a certain application by calculating the latency. The latency is simply the number of programmable logic blocks that the data flow of the application traverses from inputs to outputs.

Figure 6:
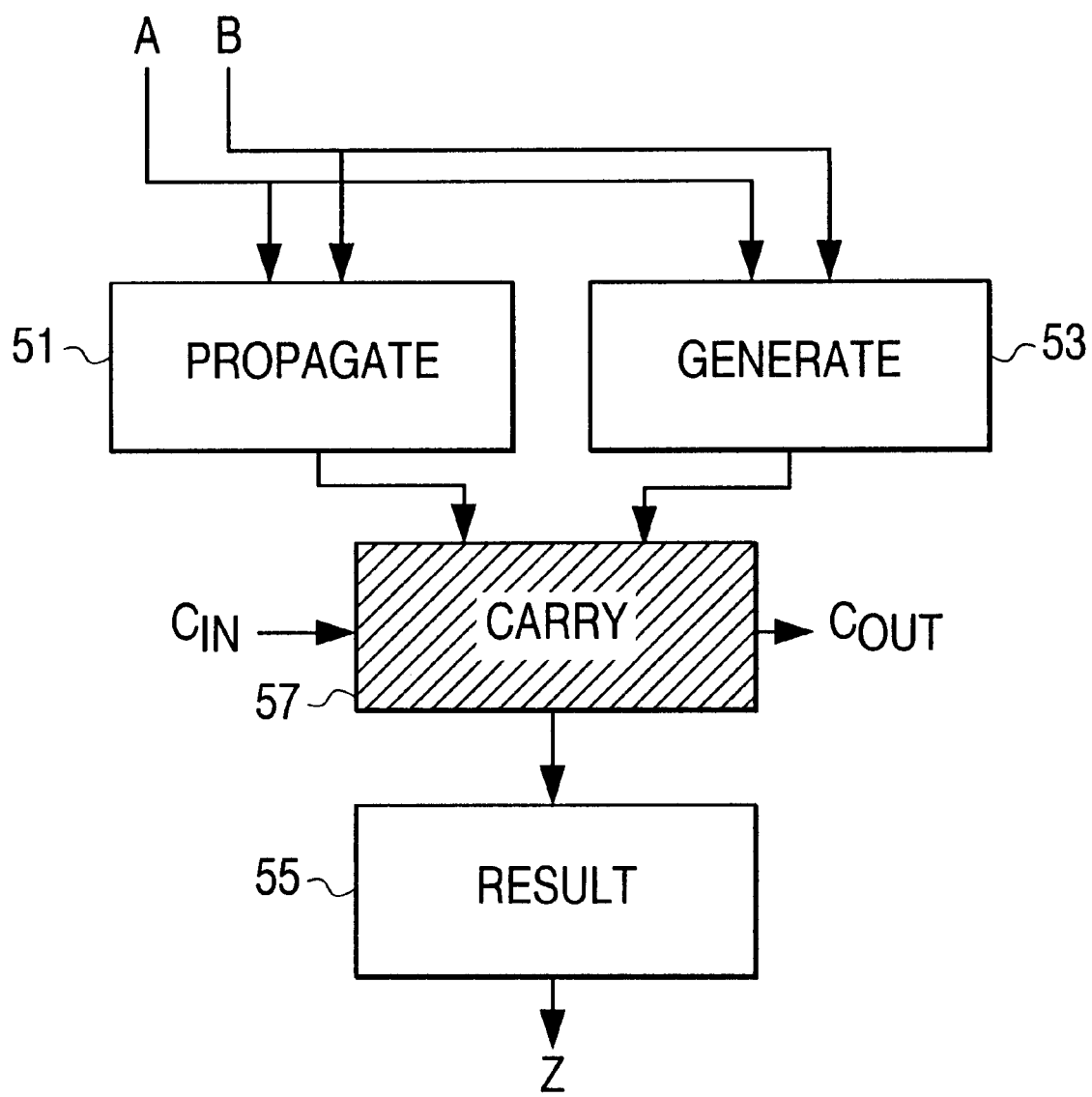
FIG. 6 shows how arithmetic operations can be decomposed into two types of function blocks.

FIG. 6 shows another method of storing arithmetic operations in CAMs and shows how arithmetic operations can be decomposed into two types of function blocks: configurable blocks that depend on the arithmetic operations being implemented; a hardwired block that is common to all arithmetic operations. It explains a partitioning method employed to handle the combinatorial complexity of storing arithmetic operations in flat structures. In FIG. 6, all arithmetic operations can be decomposed into four blocks: a propagate block 51, a generate block 53, a result block 55 and a carry path block 57. The propagate block 51, the generate block 53 and the result block 55 depend on the arithmetic operation being performed. It is therefore appropriate to map these three blocks to programmable structures. The carry path block 57 is common to all arithmetic operations, and hence is shared. The carry path block 57 is mapped to a hardwired structure.

Figure 7:
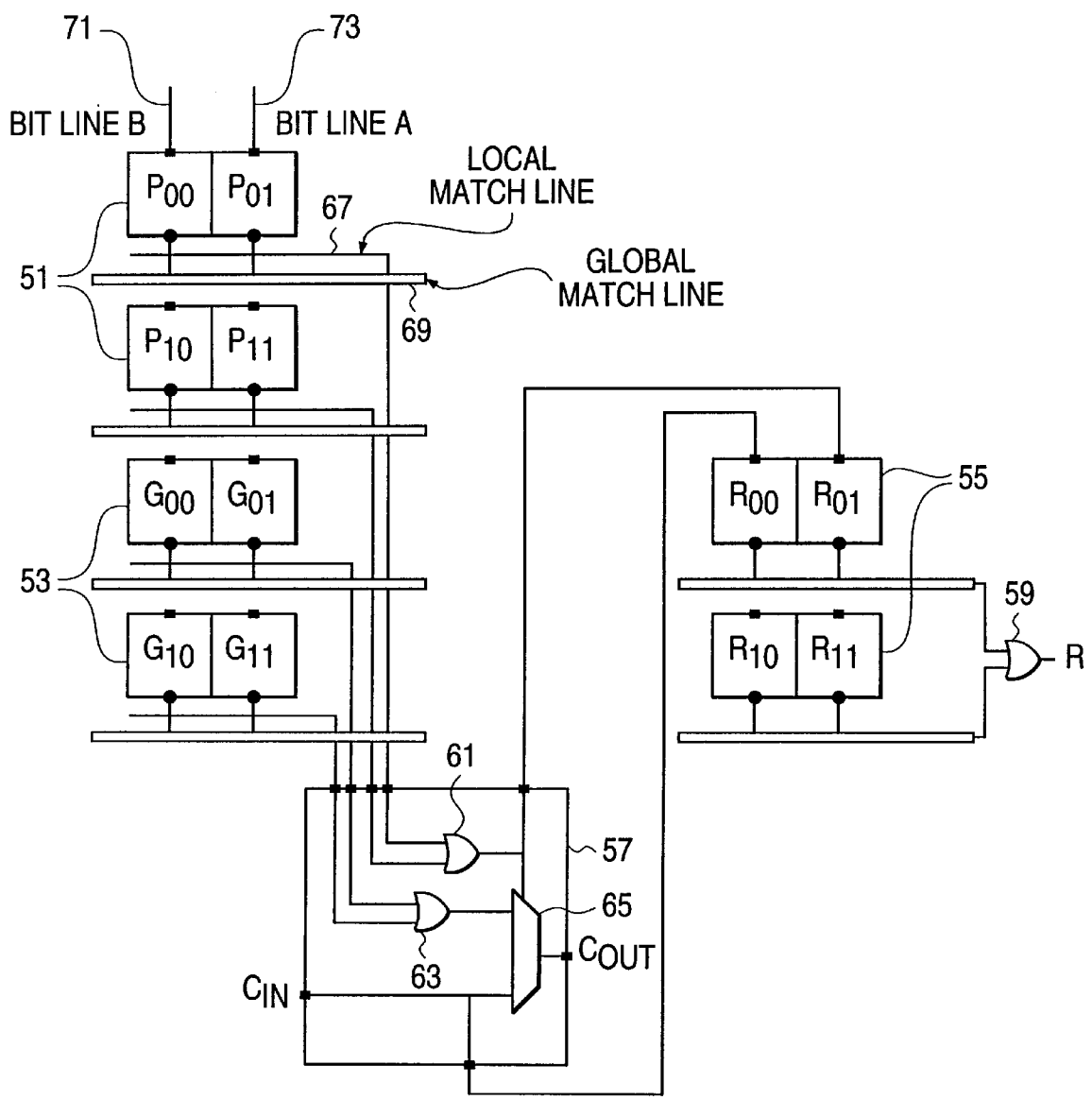
FIG. 7 is a detailed block diagram of the CAM.

FIG. 7 shows the mapping of the four blocks shown in FIG. 6 and explains the details of how an arithmetic operation can be decomposed into four functional blocks. FIG. 7 shows two CAM cell columns in the first CAM of a pair of CAMs, and two CAM cell columns in the second CAM. The propagate block 51 is mapped to a four CAM cell matrix in the first CAM. The generate block 53 is mapped to a four CAM cell matrix in the first CAM. The result block 55 is mapped to a four CAM cell matrix in the second CAM. The carry path block 57 is mapped to a special hardwired block attached to the first CAM. The inputs of the carry path block 57 are supplied by the propagate block 51 and the generate block 53, while its outputs feed the bit lines of the second CAM. The OR gate 59 deliver the final result of the arithmetic operation. The OR gate 59, as well as gates 61 and 63, is necessary because it performs the ORing of the logic products stored in each row of the three four-CAM-cell matrices. the logic products are supplied by the local match lines 67, which carry the ANDing of two CAM cell columns at a time. On the other hand, the global match lines 69, carries the result of matching the reference word, present on the bit lines 71 and 73, to the content of each row in the CAM. The bit lines 71 and 73 hold two consecutive bits of the reference word. The reference bit is compared to the content of the CAM cell 51 and the result of the comparison is fed to both the local match lines 67 and the global match lines 69. Therefore, the proposed architecture and logic blocks use the fundamental operation of content addressable memories such as comparing a reference word to the content of locations in the CAM cells 51. The comparison result is used to determine the evaluations of logic functions in general.

Figure 8:
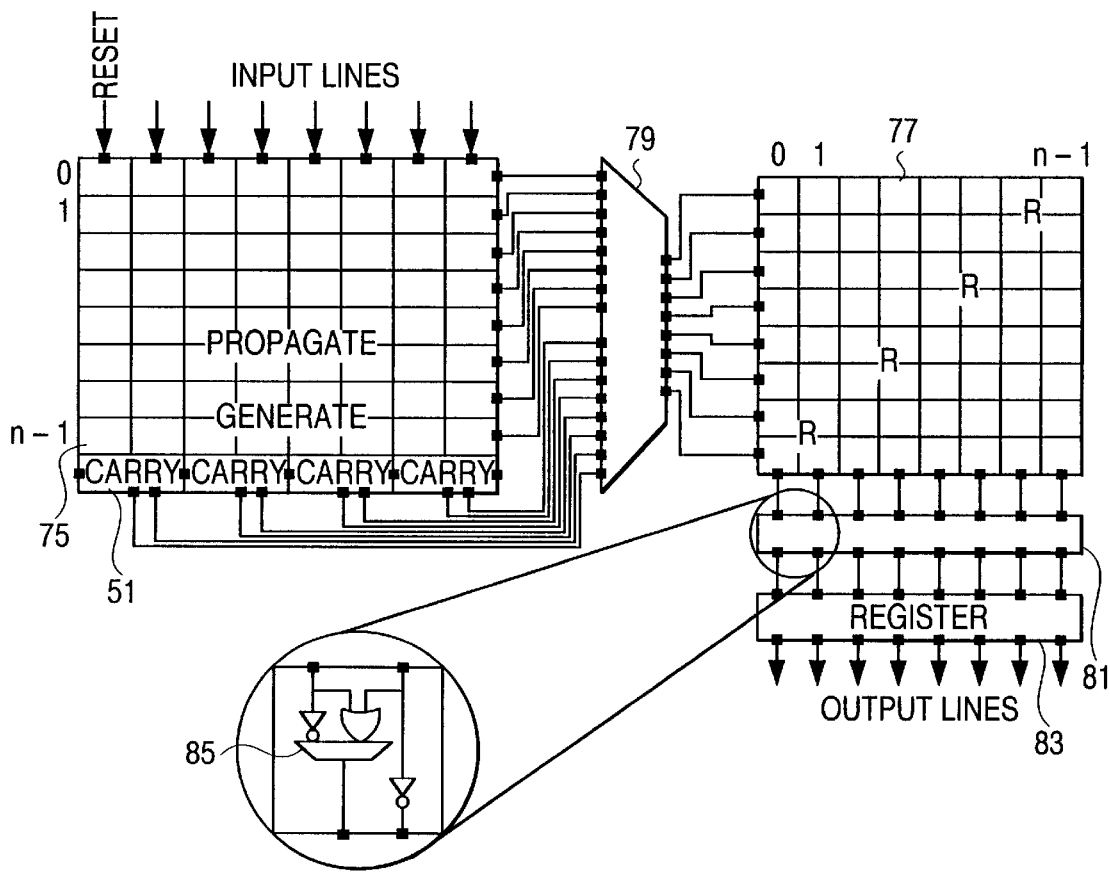
FIG. 8 shows the details of the implementation of the RTL building block.

The structure depicted in FIG. 8 results from merging the structures presented in FIGS. 5 and 7. FIG. 8 is a detailed description of the implementation of the RTL building block 11. This structure is capable of storing both random combinational logic and arithmetic operations. The first CAM 75, and the second CAM 77 correspond respectively to the AND CAM and the OR CAM. Attached to the first CAM is the carry block 57 that implements the carry ripple in arithmetic operations. The RTL building block 11 is capable of two modes of operations: random logic mode and arithmetic operation mode. The RTL building block 11 switches from one mode to another by setting the multiplexers 79 and 85 appropriately. The multiplexer 79 allows to choose between routing in the global match lines coming from the first CAM to the inputs of the second CAM, and routing in the outputs of the carry block 57 to the inputs of the second CAM. The multiplexer 85 allows either to deliver the outputs of the inverters in the case where random combinational logic is stored or deliver the outputs of the OR gates that calculate the sum of the products stored in the first CAM. In order to allow the RTL building block 11 to perform synchronous functions a transparent register 83 serves to latch out the outputs of block 81. When only combinational logic or arithmetic operations are stored the register is in transparent mode, i.e., the outputs of block 81 are directly delivered to the outside world. If synchronous functionality is to be stored, such as finite state machines, register files, the outputs of block 81 are latched in.

In FIG. 8, input lines carry the reference word to the CAM cells for a comparison with their content. The communication between the different logic blocks is carried through the interconnection. The reference word of one logic block is the result of comparisons done in another logic block. So, in general, the logic values of one logic block match-lines are carried, through the interconnection network, to the bit lines of another logic block, to become the reference word for this block.

The AND CAM 75 achieves the AND function the same way as described above. The result of the AND function of each row is carried by the global match line 69 shown in FIG. 7. The OR function can be implemented by using De Morgan's law, as illustrated in FIG. 5.

In FIG. 8, the multiplexer 79 allows to control the functionality of the logic block. The multiplexer 79 is a pair-wise selector between the global match lines 69 of FIG. 7 and carry-out signals coming from the multiplexer 65 of FIG. 7. If the multiplexer 79 selects the global match line 69 then the logic block will perform and AND-OR plane function. In the other case, the multiplexer 79 selects the carry-out signal of the multiplexer 65 and the logic block will perform an arithmetic operation. The same operation performed by the multiplexer 79 of FIG. 8 is performed by the multiplexers 81 and 85 of FIG. 8. The internals of the multiplexer 81 are illustrated by the small zoom-in figure in FIG. 8.

Figure 9:
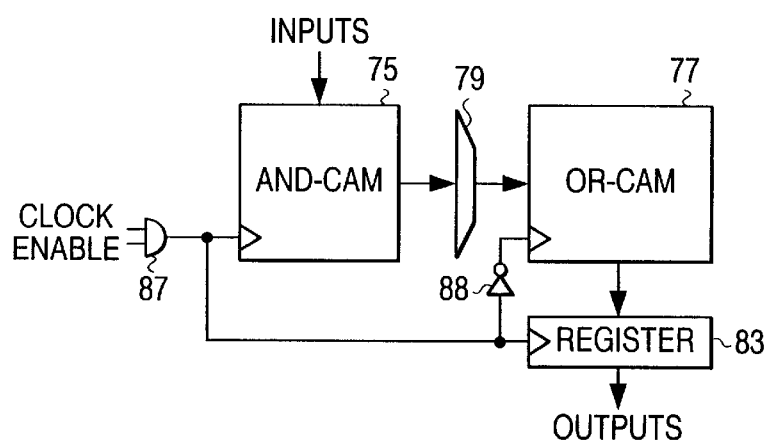
FIG. 9 is a detailed block diagram of the RTL building block.

Referring to FIG. 9 which shows a detailed RTL building block, the system clock signal and the enable signal are fed to an AND gate 87. The output is fed to the clock input terminal of the AND CAM 75, the register 83 and an inverter 88, the output of which is fed to the clock input terminals of the OR CAM 77. The enable signal allows to freeze the output of the RTL building block 11 when it is necessary by blocking the clocking off the output of the AND gate 87. This property allows to clock the RTL building blocks 11 at different clock rates.

The fact that the RTL building blocks 11 are synchronous devices guarantees that any function stored in the RTL building block 11 is performed at the same clock rate. However, if a function is performed across more than one RTL building block 11, the computation time of that function becomes also dependent on the signal propagation times between the RTL building blocks 11. Hence the computation time of said function is deterministic only when the signal propagation times between the RTL building blocks 11 is deterministic.

Figure 10A:
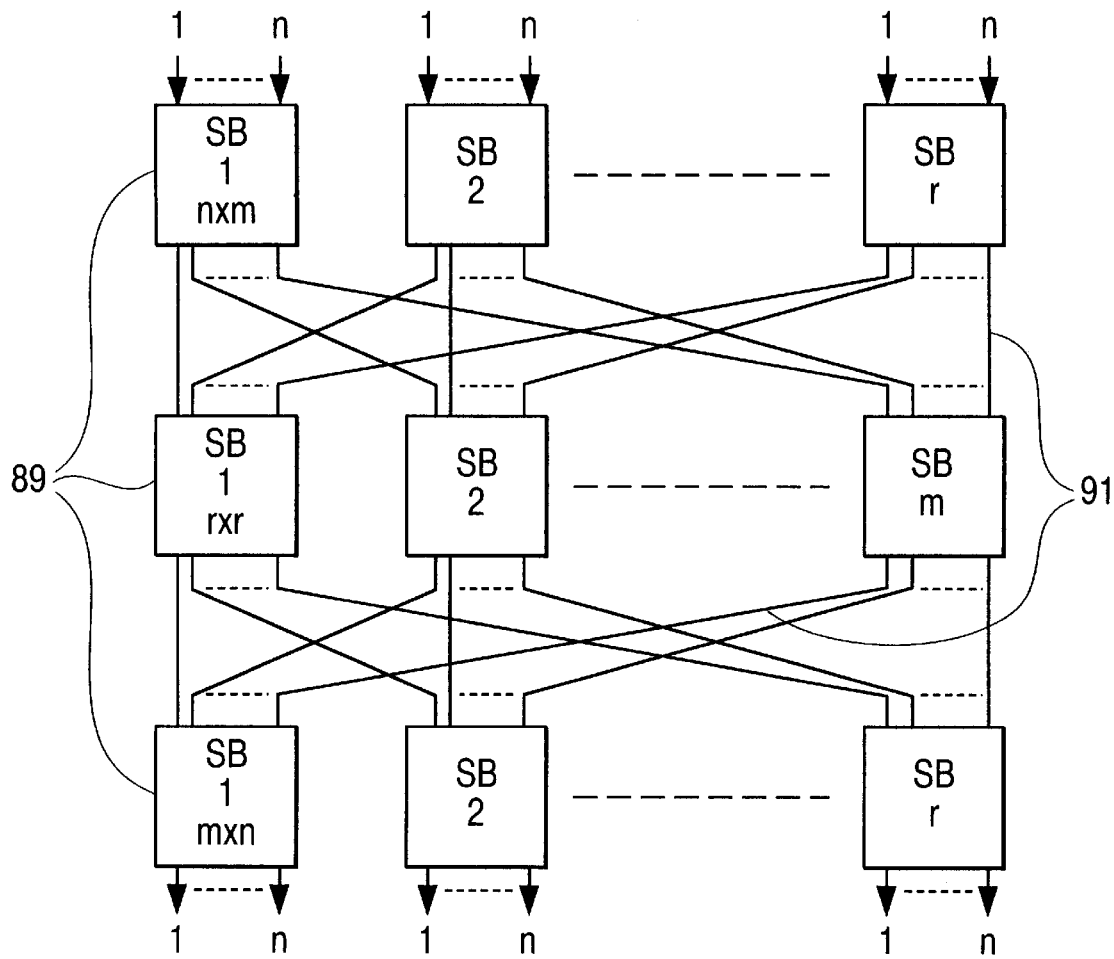
FIGS. 10A and 10B are block diagrams of an interconnection network.
Figure 10B:
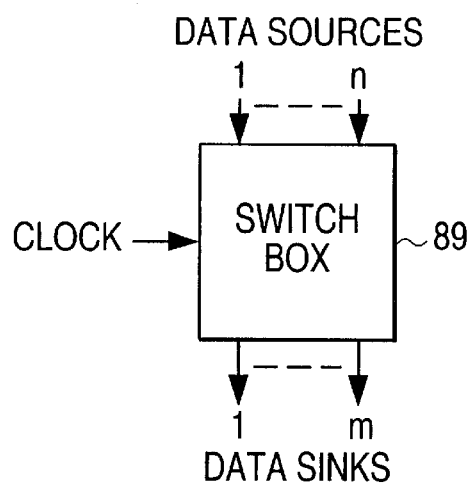

FIGS. 10A and 10B show an interconnection network that guarantees deterministic signal propagation times between the RTL building blocks 11. This network belongs to the class of synchronous dynamic multi-staged, non-blocking networks. This network is synchronous because switch boxes 89 are all driven by the same clock as the RTL building blocks 11. Data links 91 between the switch boxes 89 can be reprogrammed to connect any switch box input to a number of switch box inputs in the next stage. Also, the interconnection network carries the signals through a number of switch box stages, with each stage introducing one clock cycle delay. The communication between a data source and a data sink consumes three clock cycles as there are three stages. The interconnection network is able to establish a connection between any data source and any data sink without disrupting any other connection. In fact, this interconnection topology can be proven to be non-blocking.

Figure 11A:
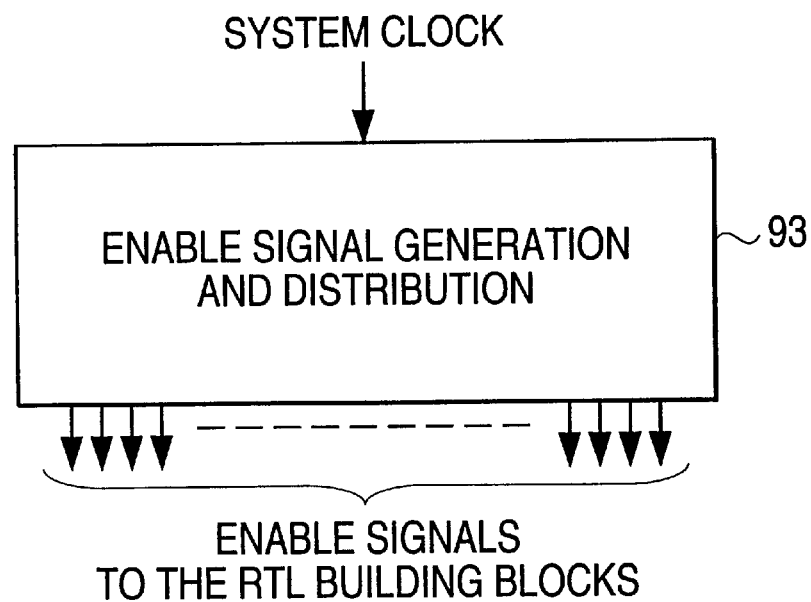
FIGS. 11A and 11B are block diagrams of an enable signal generation and distribution block and the details of the internals of the block.
Figure 11B:
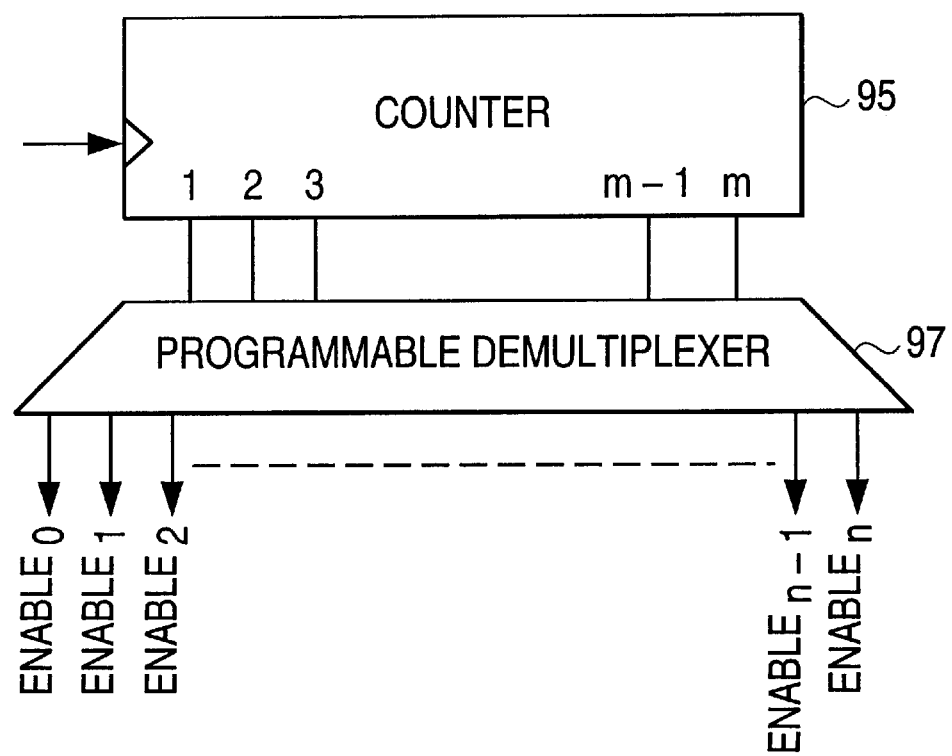

It has already been mentioned that some functions can be stored across more than one RTL building block 11. In this case some synchronization may have to be guaranteed between the different functions being stored in the architecture. In addition, since the interconnection network connecting the RTL building blocks 11 is staged, there may be some latency in the communication. This latency must be taken into account when scheduling the execution of the different functions stored in the architecture. Therefore, all RTL building blocks 11 are provided with an enable input which is used to schedule when each function is executed. The enable signals are delivered by an enable signal generation and distribution (ESGD) block 93 illustrated in FIGS. 11A and 11B, in response to the system clock signal. The ESGD block 93 includes a counter 95, the outputs of which drive a programmable de-multiplexer 97. The counter 95 produces the enable signals running at rates multiple of the system clock rate. These signals are then delivered to the RTL building blocks 11 through the programmable de-multiplexer 97, which can be programmed to route any enable signal 21 to any RTL building block 11. The routing algorithm will depend in how many and in which RTL building blocks 11 a given function is stored.

Although particular embodiments of the present invention have been described in detail, it should be appreciated that numerous variations, modifications, and adaptations may be made without departing from the scope of the present invention as defined in the claims.

What is claimed is:

1. A programmable array comprising:
   a plurality of register transfer level (RTL) building blocks, the RTL building block comprising content addressable memory (CAM) for storing data;
   an interconnection network for interconnecting the RTL building blocks to perform data input and output between the RTL building blocks; and
   a signal generation block for providing enable signals to the RTL building blocks in response to a system clock signal, the data input and output being performed, in response to the enable and the system clock signals.

2. The programmable array of claim 1, wherein the RTL building block operates in a combinational mode and an arithmetic mode.

3. The programmable array of claim 2, wherein the signal generation block comprising means for generating synchronous enable signals.

4. The programmable array of claim 3, wherein the means for generating synchronous enable signals comprising CAMs for storing only digital combinational logic data.

5. The programmable array of claim 3, wherein the signal generation block is mapped to the RTL building block, the CAMs of the RTL building blocks supporting the mapping of digital combinational logic and the mapping of arithmetic operations, both defined at the register transfer (RT) level.

6. The programmable array of claim 5, wherein the CAM of the RTL building block stores the combinational part of finite state machines (FSMs), a property that allows it to implement FSM functionality, the CAM storing digital logic data synchronously.

7. The programmable array of claim 6, wherein the interconnection network connects a two-dimensional array of the RTL building blocks.

8. The programmable array of claim 7, wherein operation of the interconnection network dynamic, so that the route between a data source and a data sink can be re-programmed, a data source can be connected to a different data sink and a data source can be connected to more than one data sink.

9. The programmable array of claim 7, wherein operation of the interconnection network is multi-stage, so that the route between a data source and a data sink traverses more than one stage of switching blocks.

10. The programmable array of claim 9, wherein the switching block comprising a pair of CAMs for storing only digital combinational logic data.

11. The programmable array of claim 10, wherein operation of the interconnection network is non-blocking, so that a connection between any data source and any data sink is established, regardless of the state of the interconnection network.

12. The programmable array of claim 11, wherein operation of the interconnection network exhibits pre-synthesis deterministic timing behavior, so that the route between any data source and any data sink traverses the same number of switching block stages, each switching block being a synchronous device that exhibits pre-synthesis deterministic timing behavior, each connection between a data source and a data sink consuming the same number of clock cycles to carry its signal.

13. A programmable logic device comprising:

signal generation means for generating enable signals in response to a system clock signal; and a plurality of plane logic array circuits operable in combinational and arithmetic modes in response to the enable and the system clock signals, each plane logic array circuit comprising a plurality of storage means, each storage means comprising content addressable memories (CAMs) for storing mapped data of digital combinational logic or arithmetic operations.

14. The programmable logic device of claim 13, further comprising means for interconnecting the plane logic array circuits for transmitting the data of digital combinational logic or arithmetic operations between the plane logic array circuits.

15. The programmable logic device of claim 14, wherein the signal generation means comprises means for generating synchronous enable signals.

16. The programmable logic device of claim 15, wherein the means for generating synchronous enable signals is supported by the CAMs of the plane logic array circuits.

17. The programmable logic device of claim 16, wherein the plane logic array circuit stores the combinational part of finite state machines (FSMs), so as to implement FSM functionality.

18. The programmable logic device of claim 15, wherein the plane logic array circuit comprises CAMs for storing digital logic data, the CAMs' timing behavior being deterministic.

19. The programmable logic device of claim 13, wherein the means for interconnecting comprises means for dynamically routing data between a data source and a data sink, so that the data route can be re-programmed, a data source can be connected to a different data sink and a data source can be connected to more than one data sink.

20. The programmable logic device of claim 19, wherein the means for dynamically routing data comprises means for establishing a connection between any data source and any data sink.

* * * * *